US012727444B2

(12) United States Patent
Piumi et al.

(10) Patent No.: US 12,727,444 B2
(45) Date of Patent: Sep. 1, 2026

(54) METHODS FOR FORMING MANDRELS AND SPACERS, RELATED STRUCTURES, AND SYSTEMS

(71) Applicant: ASM IP Holding, B.V., Almere (NL)

(72) Inventors: Daniele Piumi, Etterbeek (BE); Ivo Raaijmakers, Amersfoort (NL)

(73) Assignee: ASM IP Holding B.V., Almere (NL)

( * ) Notice: Subject to any disclaimer, the term of this patent is extended or adjusted under 35 U.S.C. 154(b) by 356 days.

(21) Appl. No.: 18/463,433

(22) Filed: Sep. 8, 2023

(65) Prior Publication Data

US 2024/0087893 A1 Mar. 14, 2024

Related U.S. Application Data

(60) Provisional application No. 63/375,264, filed on Sep. 12, 2022.

(51) Int. Cl.
*H10P 76/40* (2026.01)
*H10P 72/00* (2026.01)

(52) U.S. Cl.
CPC ...... *H10P 76/4085* (2026.01); *H10P 72/0421* (2026.01); *H10P 72/0468* (2026.01); *H10P 76/4088* (2026.01); *H10P 76/405* (2026.01)

(58) Field of Classification Search
None
See application file for complete search history.

(56) References Cited

U.S. PATENT DOCUMENTS

2017/0229314 A1* 8/2017 Tan .................. C23C 16/45536
2018/0308695 A1* 10/2018 LaVoie ................ H10P 76/4085
2021/0134595 A1* 5/2021 Su ....................... H01L 21/0337

* cited by examiner

*Primary Examiner* — Binh X Tran
(74) *Attorney, Agent, or Firm* — Banner & Witcoff, Ltd.

(57) ABSTRACT

Methods for patterning and forming structures, as well as related structures and systems are disclosed. The methods comprise forming a mandrel on a substrate. Forming the mandrel comprises executing a plurality of etching cycles to thin a structure.

20 Claims, 9 Drawing Sheets

METHODS FOR FORMING MANDRELS AND SPACERS, RELATED STRUCTURES, AND SYSTEMS

CROSS-REFERENCE TO RELATED APPLICATION(S)

This application claims the benefit of U.S. Provisional Application 63/375,264 filed on Sep. 12, 2022, the entire contents of which are incorporated herein by reference.

FIELD OF INVENTION

The present disclosure generally relates to the field of lithography, and particularly to the field of extreme ultraviolet lithography.

BACKGROUND OF THE DISCLOSURE

With the constant scaling of semiconductor devices, and the associated reduction of the critical dimensions (CD) of their constituent structures, conventional extreme ultraviolet (EUV) lithography scanners are reaching their resolution limit: certain types of isolated structure patterns (in particular, contacts and holes for vias), cannot be printed at the target critical dimensions of less than 20 nm. Accordingly, the actual critical dimension after EUV lithographic exposure is about 20 nm, higher than targeted critical dimension (CD). As scaling of integrated circuits continues, there is a need for improved methods and systems that allow manufacturing structures having feature sizes below the critical dimension after EUV lithographic exposure.

The presently disclosed methods and structures provide a solution for at least some of the above-mentioned challenges.

SUMMARY OF THE DISCLOSURE

Various embodiments of the present disclosure relate to methods, systems, and structures for increasing the resolution of patterning steps to below the optical resolution limit.

In particular, described herein is a method of forming a mandrel, the method comprises providing a substrate to a reaction chamber. The substrate comprises a material layer. The substrate further comprises a structure. The structure comprises a distal portion, a proximal portion, and two substantially parallel sidewalls. The method further comprises carrying out a plurality of etching cycles to thin the structure to form a mandrel. Ones from the plurality of etching cycles comprise subsequently executing a conversion pulse and a volatilization pulse. The conversion pulse comprises exposing the substrate to a conversion reactant. Thus, a converted surface layer is formed on the sidewalls. The volatilization pulse comprises exposing the substrate to a volatilization reactant. Thus, the converted surface layer is volatilized.

In some embodiments, the etching cycles are repeated until a pre-determined thickness of the structure has been removed from the sidewalls. The pre-determined thickness is from at least 1 nm to at most 10 nm.

In some embodiments, the distal portion comprises a distal layer that overlies the material layer. The proximal portion of the structure comprises a proximal layer. The structure further comprising a core layer. The core layer is positioned between the distal layer and the proximal layer. Two edges of the core layer form the sidewalls.

In some embodiments, the distal layer and the proximal layer have a first composition, the core layer has a second composition, and the first composition and the second composition are different.

In some embodiments, the distal and the proximal layer substantially consist of silicon oxide, and the core layer substantially consists of amorphous silicon.

In some embodiments, the conversion reactant comprises an oxygen reactant.

In some embodiments, the oxygen reactant is selected from $O_2$, $O_3$, $H_2O$, and $H_2O2$, $N_2O$, NO, $NO_2$, and oxygen-containing plasma.

In some embodiments, the volatilization reactant comprises a fluorine species.

In some embodiments, the fluorine species are generated using a plasma.

In some embodiments, the fluorine species is selected from fluorine radicals, fluoride ions, $F_2$, HF, and $NF_3$.

In some embodiments, a distance between the distal portion and the proximal portion is greater than a distance between the two substantially parallel sidewalls.

Further described herein is a method that comprises providing a system. The system comprises a first reaction chamber and a second chamber. The method further comprises forming a mandrel on a substrate in the first reaction chamber by means of a method as described herein. The method further comprises providing the substrate to the second reaction chamber while keeping the substrate in vacuum or in an inert gas. The method further comprises forming an etchable layer on the substrate in the second reaction chamber.

Further described herein is a method for forming a spacer. The method comprises providing a system. The system comprises a first reaction chamber, a second chamber, and a third reaction chamber. The method further comprises forming a mandrel on a substrate in the first reaction chamber by means of a method as described herein. The method further comprises providing the substrate to the second reaction chamber while keeping the substrate in vacuum or an inert gas. The method further comprises forming an etchable layer on the substrate in the second reaction chamber. The method further comprises providing the substrate to the third reaction chamber while keeping the substrate in vacuum or in an inert gas. The method further comprises etching the etchable layer by means of a directional etch. The method further comprises selectively etching the mandrel vis-à-vis the etchable layer and the material layer. Thus, a spacer is formed.

Further described herein is a method of patterning a substrate. The method comprises providing a substrate that comprises a patternable layer. The method further comprises forming a structural layer on the patternable layer. The method further comprises forming a photosensitive layer on the structural layer. The method further comprises exposing the photosensitive layer to electromagnetic radiation through a mask, to form exposed areas of the patternable layer and unexposed areas of the patternable layer. The method further comprises selectively removing one of the exposed areas and the unexposed areas. The method further comprises etching the patternable layer in one of the exposed areas and the unexposed areas to form a plurality of structures on the substrate. The method further comprises removing the photosensitive layer from the substrate. The method further comprises forming a plurality of spacers on the substrate by means of a method according to any one of claims 1 to 11. The method further comprises selectively etching the patternable layer vis-à-vis the plurality of spacers. Thus, a patterned layer is formed on the substrate.

Further described herein is a method of patterning a substrate. The method comprises providing a substrate. The substrate comprises a patternable layer. The method further comprises forming a photosensitive layer on the patternable layer. The method further comprises exposing the photosensitive layer to electromagnetic radiation through a mask. Thereby exposed areas of the patternable layer and unexposed areas of the patternable layer are formed. The method further comprises forming a plurality of structures on one of the exposed areas and the unexposed areas of the patternable layer. The method further comprises forming a plurality of mandrels on the substrate by means of a method as described herein. The method further comprises selectively etching the patternable layer vis-à-vis the plurality of mandrels. Thus, a patterned layer is formed on the substrate.

Further described herein is a semiconductor processing apparatus that comprises an atomic layer etching chamber, an etchable layer deposition chamber, and a wafer handling robot. The atomic layer etching chamber is in fluid connection with a conversion reactant source by means of a conversion reactant gas line comprising a conversion reactant valve. The atomic layer etching chamber is in fluid connection with a volatilization reactant source by means of a volatilization reactant gas line that comprises a volatilization reactant valve. The atomic layer etching chamber is configured for carrying out a plurality of etching cycles. Ones from the plurality of etching cycles comprise subsequently executing a conversion pulse and a volatilization pulse. The etchable layer deposition chamber is in fluid connection with a deposition precursor source by means of a deposition precursor gas line that comprises a deposition precursor valve. The etchable layer deposition chamber is in fluid connection with a deposition reactant source by means of a deposition reactant gas line that comprises a deposition reactant valve. The wafer handling robot is configured to provide a substrate to the atomic layer etching chamber and to transport the substrate from the atomic layer etching chamber to the etchable layer deposition chamber without breaking vacuum, or while keeping the substrate in an inert gas.

Further described herein is a semiconductor processing apparatus that comprises an atomic layer etching chamber, an etchable layer deposition chamber, a reactive ion etch chamber, and a wafer handling robot. The atomic layer etching chamber is in fluid connection with a conversion reactant source by means of a conversion reactant gas line that comprises a conversion reactant valve. The atomic layer etching chamber is in fluid connection with a volatilization reactant source by means of a volatilization reactant gas line that comprises a volatilization reactant valve. The atomic layer etching chamber is configured for carrying out a plurality of etching cycles. Ones from the plurality of etching cycles comprise subsequently executing a conversion pulse and a volatilization pulse. The etchable layer deposition chamber is in fluid connection with a deposition precursor source by means of a deposition precursor gas line that comprises a deposition precursor valve. The etchable layer deposition chamber is in fluid connection with a deposition reactant source by means of a deposition reactant gas line that comprises a deposition reactant valve. The reactive ion etching chamber is configured for carrying out a reactive ion etch. The reactive ion etching chamber is in fluid connection with a reactive ion etch gas source by means of a reactive ion etch gas line that comprises a reactive ion etch gas valve. The wafer handling robot is configured to provide a substrate to the atomic layer etching chamber, to transport the substrate from the atomic layer etching chamber to the etchable layer deposition chamber without breaking vacuum or while keeping the substrate in an inert gas; and to transport the substrate from the etchable layer deposition chamber to the reactive ion etching chamber without breaking vacuum or while keeping the substrate in an inert gas.

In some embodiments, the system further comprises a controller. The controller is configured for causing the system to carry out a method as described herein.

These and other embodiments will become readily apparent to those skilled in the art from the following detailed description of certain embodiments having reference to the attached figures; the invention not necessarily being limited to any particular embodiment(s) disclosed.

BRIEF DESCRIPTION OF THE FIGURES

A more complete understanding of exemplary embodiments of the present disclosure can be derived by referring to the detailed description and claims when considered in connection with the following illustrative figures.

Figure 1:
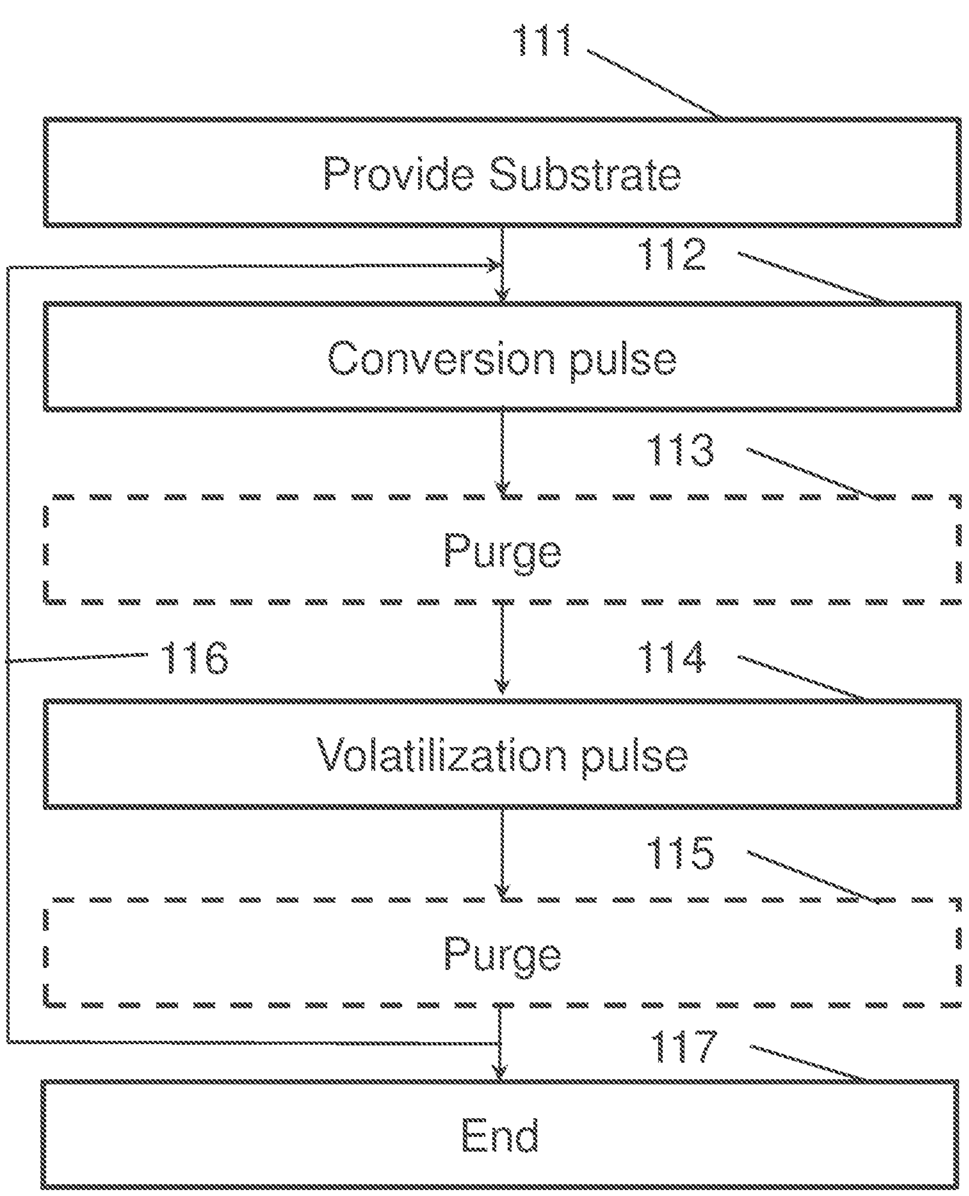
FIGS. 1 and 2 show flow charts of embodiments of methods as described herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of the present invention provided below is merely exemplary and is intended for purposes of illustration only; the following description is not intended to limit the scope of the invention disclosed herein. Moreover, recitation of multiple embodiments having stated features is not intended to exclude other embodiments having additional features or other embodiments incorporating different combinations of the stated features.

As used herein, the term substrate may refer to any underlying material or materials including and/or upon which one or more layers can be deposited. A substrate can include a bulk material, such as silicon (e.g., single-crystal silicon), other Group IV materials, such as germanium, or compound semiconductor materials, such as GaAs, and can include one or more layers overlying or underlying the bulk material. For example, a substrate can include a patterning stack of several layers overlying bulk material. The patterning stack can vary according to application and can include, for example, a hard mask, such as a metal hard mask, an oxide hardmask, a nitride hardmask, a carbide hardmask, or an amorphous carbon hardmask. Further, the substrate can additionally or alternatively include various features, such as recesses, lines, and the like formed within or on at least a portion of a layer of the substrate.

In this disclosure, gas may include material that is gaseous at room temperature and atmospheric pressure, a vaporized solid and/or a vaporized liquid, and may be constituted by a single gas or a mixture of gases, depending on the context. A gas other than the process gas, i.e., a gas introduced without passing through a gas distribution assembly, such as a showerhead, other gas distribution device, or the like, may be used for, e.g., sealing the reaction space, and may include a seal gas, such as a noble gas.

In some cases, such as in the context of deposition of material, the term precursor can refer to a compound or compounds that participates in the chemical reaction that produces another compound, and particularly to a compound that constitutes a film matrix or a main skeleton of a film, whereas the term reactant can refer to a compound, in some cases other than precursors, that reacts with the precursor, activates the precursor, modifies the precursor, or catalyzes a reaction of the precursor; a reactant may provide an element to a film and become a part of the film. In some cases, the terms precursor and reactant can be used interchangeably. A precursor can be gaseous. A precursor can be an evaporated solid or a sublimed solid.

The term cyclic deposition process or cyclical deposition process may refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component. In other cases, the processing techniques may include a plasma process such as plasma enhanced CVD (PECVD) or plasma enhanced ALD (PEALD), which may be preferred in some implementations because they allow working at lower temperatures.

The term atomic layer deposition may refer to a vapor deposition process in which deposition cycles, typically a plurality of consecutive deposition cycles, are conducted in a process chamber. The term atomic layer deposition, as used herein, is meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a reactant may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

The term atomic layer etching may refer to a vapor etching process in which etching cycles, typically a plurality of consecutive etching cycles, are conducted in a process chamber. An etching cycle can comprise two or more etching pulses. In an atomic layer etching process, at least one of these etching pulses can be self-limiting. An atomic layer etching process can comprise purges after one or more etching pulses.

An atomic layer etch is an embodiment of a cyclic etch. A cyclic etch comprises etching cycles, typically a plurality of consecutive etching cycles, that are conducted in a process chamber. A cyclical etch does not necessarily comprise one or more self-limiting etching pulses. A cyclical etching process can comprise purges after one or more etching pulses.

As used herein, the term purge or purging may refer to a procedure in which gas flow is stopped or a procedure involving continual provision of a carrier gas whereas precursor flow is intermittently stopped. For example, a purge may be provided between a precursor pulse and a reactant pulse, thus avoiding, or at least reducing, gas phase interactions between the precursor and the reactant. It shall be understood that a purge can be effected either in time or in space or both. For example, in the case of temporal purges, a purge step can be used, e.g., in the temporal sequence of providing a precursor to a reactor chamber, providing a purge gas to the reactor chamber, and providing a reactant to the reactor chamber, wherein the substrate on which a layer is deposited does not move. In the case of spatial purges, a purge step can take the form of moving a substrate from a first location to which a precursor is supplied, through a purge gas curtain, to a second location to which a reactant is supplied.

In this disclosure, any two numbers of a variable can constitute a workable range of the variable, and any ranges indicated may include or exclude the endpoints. Additionally, any values of variables indicated may refer to precise values or approximate values and include equivalents, and may refer to average, median, representative, majority, etc. in some embodiments. Further, in this disclosure, the terms including, constituted by and having can refer independently to typically or broadly comprising, comprising, consisting essentially of, or consisting of in some embodiments. Further, the term comprising can include consisting of or consisting essentially of. In accordance with aspects of the disclosure, any defined meanings of terms do not necessarily exclude ordinary and customary meanings of the terms.

Patterning structures at increasingly smaller dimensions becomes increasingly difficult in integrated circuit manufacture. The present disclosure relates to a particular approach for forming features which have a critical dimension smaller than the optical resolution of a particular patterning system, such as an extreme ultraviolet (EUV) patterning system. The presently disclosed methods for forming mandrels can be particularly suitable for forming features in material layers which have a critical dimension which is lower than the resolution of a particular patterning system which is employed in the corresponding process flow.

Described herein is a method of forming a mandrel. The method comprises providing a substrate to a reaction chamber. The substrate comprises a material layer. Suitable material layers include metal, dielectric, and semiconductor layers. The material layer can have a thickness of, for example, from at least 0.3 nm to at most 50 nm, such as from at least 1.0 nm to at most 10 nm. Patterning material layers is a key activity in integrated circuit manufacture. The substrate further comprises a structure. The structure comprises a distal portion, a proximal portion, and two substantially parallel sidewalls.

The method further comprises carrying out a plurality of etching cycles. Individual etching cycles comprise subsequently executing a conversion pulse and a volatilization pulse.

Individual conversion pulses comprise exposing the substrate to a conversion reactant. Thus, a converted surface layer is formed on the sidewalls. It shall be understood that the conversion pulses and the volatilization pulses do not overlap, or do not substantially overlap, i.e. they are carried out sequentially. In some embodiments, the conversion pulses and the volatilization pulses are separated by purges. A purge can comprise providing a noble gas to the reaction chamber, thereby purging reaction products and any excess reactant from the substrate.

Individual volatilization pulses comprise exposing the substrate to a volatilization reactant. Thus, the converted surface layer is volatilized. Thus a portion of the sidewall is removed. In some embodiments, a portion of the structure at the proximal end is removed too. By carrying out a pre-determined amount of etching cycles, a pre-determined amount of sidewall can be removed from the structure to form a mandrel.

In some embodiments, the structure comprises a proximal layer, a core layer, and a distal layer, and during the conversion pulse, sidewalls of the structure in which the core layer is exposed, are converted into a converted surface layer.

By carrying out the plurality of etching cycles, the structure is gradually thinned and a mandrel is formed. Indeed, the etching cycles can incrementally remove material from both sidewalls. Optionally, material can be removed from the proximal portion as well, particularly when the structure comprises a material that is exposed at both the sidewalls and the proximal portion. Thus, the structure can be incrementally thinned and a mandrel can be formed.

Advantageously, the presently disclosed methods can be employed to form mandrels with small critical dimensions and low lateral edge roughness. The critical dimension of the mandrel can be particularly smaller than the resolution limit of the lithography apparatus that is employed for forming the structure that the mandrel is made from.

The mandrels can be advantageously employed in the context of patterning semiconductor substrates, for example using extreme ultraviolet (EUV) light. In particular, the mandrels advantageously allow reducing the critical dimension of features that can be patterned. Accordingly, patterns having a critical dimension of less than 20 nm can be efficiently formed, thereby circumventing current EUV resolution limits.

A method as described herein can employ any suitable resist for forming the structure from which the mandrel is formed. In some embodiments, the resist is a resist that is sensitive to extreme ultraviolet radiation (EUV resist). Suitably, the radiation employed for partially exposing the substrate to radiation through a mask. An EUV photoresist layer may include any suitable photoresist, such as molecular, metal oxide, or chemically amplified photoresist. It shall be understood that the photoresists can be formed using any suitable deposition technique, including chemical vapor deposition (CVD), plasma-enhanced chemical vapor deposition (PECVD), atomic layer deposition (ALD), and plasma-enhanced atomic layer deposition (PEALD).

Choosing a suitable amount of etching cycles can allow removing a suitable amount of material from the sidewalls of the structure. Thus, in some embodiments, the etching cycles are repeated until a pre-determined thickness of the structure has been removed from the sidewalls. The pre-determined thickness can range from at least 1 nm to at most 10 nm, for example from at least 2 nm to at most 5 nm, for example 3.5 nm.

The structure can have a homogeneous composition, or it can have internal structure. In some embodiments, the distal portion of the structure comprises a distal layer. The distal layer overlies the material layer. In such embodiments, the proximal portion of the structure can comprise a proximal layer, and the structure can further comprise a core layer. The core layer can be positioned between the distal layer and the proximal layer. The two edges of the core layer form the sidewalls. For example, the core layer can comprise amorphous silicon, and the distal layer and the proximal layer can comprise silicon oxide.

The distal layer and the core layer can have a composition which is different from the composition of the core layer. Thus, in some embodiments, the distal layer and the proximal layer have a first composition and the core layer has a second composition. The first composition and the second composition are different. In some embodiments, the distal and the proximal layer substantially consist of silicon oxide, and the core layer substantially consists of amorphous silicon. Alternative core materials include carbon, silicon carbide, and silicon nitride.

Suitably, the structure can be taller than it is wide. In particular, the distance between the distal portion and the proximal portion can be greater than the distance between the two substantially parallel sidewalls. Structures that are higher than they are wide are useful since their height is, in relative terms, diminished to a lesser extent by cyclical etch when forming the mandrel.

Suitably, a structure can be thinned to form a mandrel using a cyclical etch. Suitable cyclical etches include alternating exposure to a conversion reactant and to a volatilization reactant. In some embodiments, the conversion reactant comprises an oxygen reactant. Suitable oxygen reactants include $O_2$, $O_3$, $H_2O$, and $H_2O_2$, $N_2O$, NO, and $NO_2$. In some cases a plasma such as an indirect plasma, a direct plasma, or a remote plasma can be used to form an oxygen reactant such as at least one of oxygen radicals and oxygen ions. In some embodiments, the volatilization reactant can comprise a fluorine species. Suitable fluorine species include fluorine radicals, fluoride ions, $F_2$, HF, and $NF_3$. In some embodiments, the fluorine species is generated by means of a plasma such as a remote $SF_6$ plasma.

A combination of an oxygen-containing conversion reactant and a fluorine-containing volatilization reactant can be useful for forming a mandrel comprising amorphous silicon, such as a mandrel from a structure comprising an amorphous silicon core, a silicon oxide proximal layer, and a silicon oxide distal layer.

A method as described herein can further comprise depositing an etchable layer. Thus, further described herein is a method that comprises providing a system. The system comprises a first reaction chamber and a second reaction chamber. The method further comprises forming a mandrel on a substrate in the first reaction chamber by means of a method as described herein. The method further comprises providing the substrate to the second reaction chamber. It shall be understood that this can be done while keeping the substrate in a vacuum or in an inert gas. The method further comprises forming an etchable layer on the substrate in the second reaction chamber. Suitable inert gasses can include nitrogen ($N_2$) and noble gasses such as helium (He), neon (Ne), argon (Ar), krypton (Kr), and xenon (Xe). In some embodiments, the term "inert gas" is mutually interchangeable with the terms "inert gas environment" or "purged environment".

Advantageously, keeping the substrate in vacuum or in an inert gas after forming the mandrel results in improved control and enhanced properties of the mandrel-etchable layer interface.

In some embodiments, the mandrel is not photoactive. In other words, and in some embodiments, the mandrel does not undergo any change in properties upon exposure to electromagnetic radiation such as visible light, ultraviolet light, or extreme ultraviolet light.

Exemplary deposition methods for forming the etchable layer can be or include cyclical deposition methods, such as ALD and pulsed CVD methods, and can include, in some useful embodiments, indirect, direct, and remote plasma methods, which may include super cycle processes in which sub-cycles may be selectively repeated to enhance tuning (e.g., to achieve a desired amount or concentration of a desired element in the absorber or underlayer or the like). An etchable layer as described herein can be formed using thermal chemical vapor deposition (CVD), pulsed CVD, thermal atomic layer deposition (ALD), plasma-enhanced CVD (PECVD), or plasma-enhanced ALD (PEALD). All these approaches may suitably provide for the deposition of thin (less than 5 nm thick) etchable layers with low non-uniformity. In some embodiments, the etchable layer comprises at least one of silicon nitride (SiN) and silicon oxycarbide (SiOC).

Further described herein is a method for forming a spacer. The method comprises providing a system. The system comprises a first reaction chamber, a second reaction chamber, and a third reaction chamber. The method further comprises forming a mandrel on the substrate in the first reaction chamber by means of a method as described herein. The method further comprises providing the substrate to the second reaction chamber while keeping the substrate in vacuum or in an inert gas. The method further comprises forming an etchable layer on the substrate in the second reaction chamber. The method further comprises providing the substrate to the third reaction chamber while keeping the substrate in vacuum or in an inert gas. The method further comprises etching the etchable layer by means of a directional etch and selectively etching the mandrel vis-à-vis the etchable layer and the material layer. It shall be understood that a directional or anisotropic etch refers to an etch that has a higher etch rate in a direction perpendicular to the substrate surface compared to directions parallel to the substrate surface. Thus, a spacer is formed. Suitably, thin spacers can be formed using this method. The thickness of the spacer corresponds approximately to the thickness of the etchable layer.

Methods for forming a spacer as described herein can be suitably employed for patterning a substrate by means of a photoresist. Thus, further described herein is a method of patterning a substrate. The method comprises providing a substrate. The substrate comprises a patternable layer. The patternable layer can comprise hard masks, scintillator layers, or other ancillary layers such as amorphous carbon, SiOC layers, and SiOCN layers. Such layers can be applied using wet processing techniques such as spin coating or using vapor phase techniques such as chemical vapor deposition, atomic layer deposition, and plasma-enhanced versions thereof. The method further comprises forming a structural layer on the patternable layer. It shall be understood that the structural layer can refer to a precursor layer from which a mandrel can be made. The method further comprises forming a photosensitive layer, such as a resist, on the structural layer. The method further comprises exposing the photosensitive layer to electromagnetic radiation through a mask. Thus, exposed areas of the patternable layer and unexposed areas of the patternable layer are formed. Depending on whether a positive or negative resist is used, the method further comprises selectively removing one of the unexposed areas and the exposed areas. The method further comprises etching the patternable layer in one of the exposed areas and the unexposed areas. Thus a plurality of structures are formed on the substrate. Remaining photosensitive layer from the unexposed or exposed areas is then removed from the substrate. The method further comprises forming a plurality of spacers on the substrate by means of a method as described herein. It shall be understood that the plurality of spacers can be formed simultaneously. The method further comprises selectively etching the patternable layer vis-à-vis the plurality of spacers. Thus, a patterned layer can be formed on the substrate.

Methods for forming a spacer as described herein can be suitably employed for patterning a substrate by means of a photosensitive layer and photo-induced selective growth. Thus, further described herein is a method of patterning a substrate. The method comprises providing a substrate. The substrate comprises a patternable layer. The method further comprises forming a photosensitive layer on the patternable layer. The method further comprises patterning the photosensitive layer. Patterning can suitably comprise exposing the photosensitive layer to electromagnetic radiation to form exposed areas of the patternable layer and unexposed areas of the patternable layer. Optionally, one of the exposed areas and unexposed areas can be removed from the substrate. The method then comprises forming a plurality of structures on one of the exposed areas and the unexposed areas of the patternable layer. Then, the method comprises forming a plurality of mandrels on the substrate by means of a method as described herein. Then, the method comprises selectively etching the patternable layer vis-à-vis the plurality of mandrels. Thus, a patterned layer is formed on the substrate.

A method as described herein can be carried out in any suitable system. An exemplary system comprises two reaction chambers between which substrates can be transported without breaking vacuum or while keeping the substrate in an inert gas. Thus, further described herein is a semiconductor processing apparatus that comprises an atomic layer etching chamber, an etchable layer deposition chamber, and a wafer handling robot. The atomic layer etching chamber is in fluid connection with a conversion reactant source by means of a conversion reactant gas line. The conversion reactant gas line comprises a conversion reactant valve. The atomic layer etching chamber is further in fluid connection with a volatilization reactant source by means of a volatilization reactant gas line. The volatilization reactant gas line comprises a volatilization reactant valve. The atomic layer etching chamber is further configured for carrying out a plurality of etching cycles. Ones from the plurality of etching cycles comprise subsequently executing a conversion pulse and a volatilization pulse. The etchable layer deposition chamber is in fluid connection with a deposition precursor source by means of a deposition precursor gas line. The deposition precursor gas line comprises a deposition precursor valve. The etchable layer deposition chamber is in fluid connection with a deposition reactant source by means of a deposition reactant gas line that comprises a deposition reactant valve. The wafer handling robot is configured for providing a substrate to the atomic layer etching chamber. The wafer handling robot is further configured to transport the substrate from the atomic layer etching chamber to the etchable layer deposition chamber without breaking vacuum or while keeping the substrate in an inert gas. It shall be understood that such a system can further comprise a controller that can operate the system's various components such as valves and robots, and that can be configured for causing the system to carry out a method as described herein. It shall be understood that the phrase "without breaking vacuum" indicates that a substrate is transported from one place to the other while the substrate is maintained at sub-atmospheric pressure, for example at a pressure of at least 0.1 Torr to at most 100 Torr, or at a pressure from at least 1 Torr to at most 10 Torr.

Another embodiment of a system in which a method as described herein can be carried out comprises three reaction chambers between which substrates can be transported without breaking vacuum or while keeping the substrate in an inert gas. Thus, further described herein is a semiconductor processing apparatus that comprises an atomic layer etching chamber, an etchable layer deposition chamber, a reactive ion etch chamber, and a wafer handling robot. The atomic layer etching chamber is in fluid connection with a conversion reactant source by means of a conversion reactant gas line. The conversion reactant gas line comprises a conversion reactant valve. The atomic layer etching chamber is in fluid connection with a volatilization reactant source by means of a volatilization reactant gas line. The volatilization reactant gas line comprises a volatilization reactant valve. The atomic layer etching chamber is further configured for carrying out a plurality of etching cycles. Individual etching cycles comprise subsequently executing a conversion pulse and a volatilization pulse. The etchable layer deposition chamber is in fluid connection with a deposition source by means of a deposition precursor gas line. The deposition precursor gas line comprises a deposition precursor valve. The etchable layer deposition chamber is further in fluid connection with a deposition reactant source by means of a deposition reactant gas line. The deposition reactant gas line comprises a deposition reactant valve. The reactive ion etching chamber is configured for carrying out a reactive ion etch. The reactive ion etching chamber is further in fluid connection with a reactive ion etch gas source by means of a reactive ion etch gas line. The reactive ion etch gas line comprises a reactive ion etch gas valve. The wafer handling robot is configured to transport substrates, in particular wafers, in the system. Thus, the wafer handling robot is configured to provide a substrate to the atomic layer etching chamber. The wafer handling robot is further configured to transport the substrate from the atomic layer etching chamber to the etchable layer deposition chamber without breaking vacuum or while keeping the substrate in an inert gas. The wafer handling robot is further configured to transport the substrate from the etchable layer deposition chamber to the reactive ion etching chamber without breaking vacuum or while keeping the substrate in an inert gas. In some embodiments, the system comprises a controller that is configured for causing the system to execute a method as described herein.

FIG. 1 shows a flow chart of an embodiment of a method as described herein. In particular, shown is an embodiment of a method of forming a mandrel which starts with a step (111) of providing a substrate to a reaction chamber. The substrate comprises a material layer. It shall be understood that a material layer can refer to a layer on a substrate that is to be patterned, i.e., it is desirable to remove a part of that layer in a pre-determined pattern. Patterning layers can be useful for fabricating integrated circuits. The substrate further comprises a structure. The structure comprises a distal portion, a proximal portion, and two substantially parallel sidewalls. The substrate is then subjected to a plurality of etching cycles (116) in the reaction chamber. The etching cycles (116) can incrementally remove material from both sidewalls. Thus, the structure can be incrementally thinned and a mandrel can be formed. In some embodiments, material is also removed from the proximal surface of the structure. Ones from the plurality of etching cycles (116) comprise subsequently executing a conversion pulse (112) and a volatilization pulse (114). Optionally, at least one of the conversion pulse (112) and the volatilization pulse (114) is followed by a purge (113, 115). The conversion pulse (112) comprises exposing the substrate to a conversion reactant. Thus, a converted surface layer is formed on the sidewalls. The volatilization pulse (114) comprises exposing the substrate to a volatilization reactant. The volatilization pulse (114) comprises exposing the substrate to a volatilization reactant. Exposing the substrate to the volatilization reactant results in volatilization of the converted surface layer. In each of the etching cycles (116), a portion of the sidewall is removed. By carrying out a pre-determined amount of etching cycles, a pre-determined amount of sidewall can be removed from the structure to form a mandrel. When the mandrel has been formed, the method according to FIG. 1 ends (117).

Figure 2:
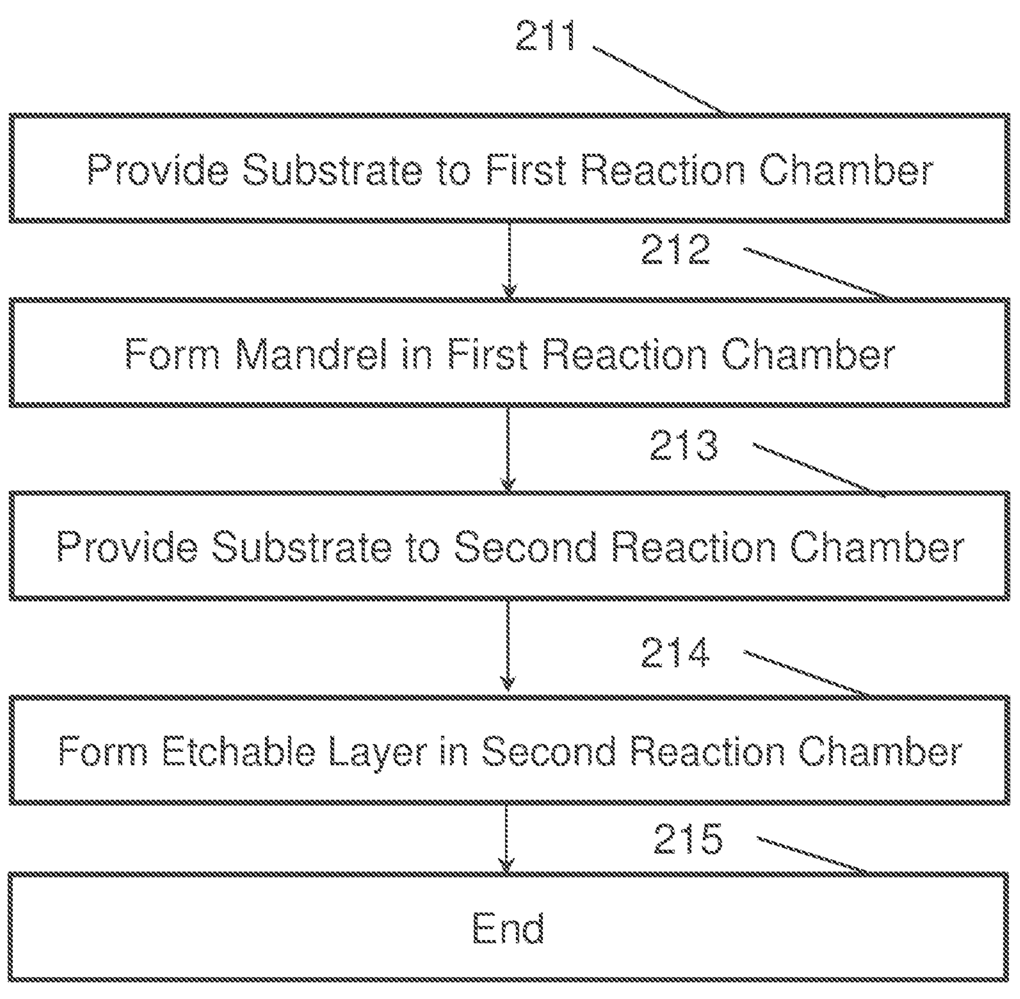

In a further example, reference is made to a method according to FIG. 2. The method comprises a step (211) of providing a substrate to a first reaction chamber. The first reaction chamber is comprised in a system that further comprises a second reaction chamber. Then, the method comprises a step (212) of forming a mandrel on the substrate by means of a method as described herein. Then, the method comprises a step (213) of providing the substrate to a second reaction chamber comprised in the same system. This providing step (213) is carried out while keeping the substrate in vacuum or while keeping the substrate in an inert gas. Then, the method comprises a step (214) of forming an etchable layer on the substrate in the second reaction chamber, after which the method of FIG. 2 ends (215). Thus, an etchable layer can be advantageously deposited on a mandrel without any intervening vacuum break, or while keeping the substrate in an inert gas, which can improve the quality of semiconductor processing sequences.

Figure 3:
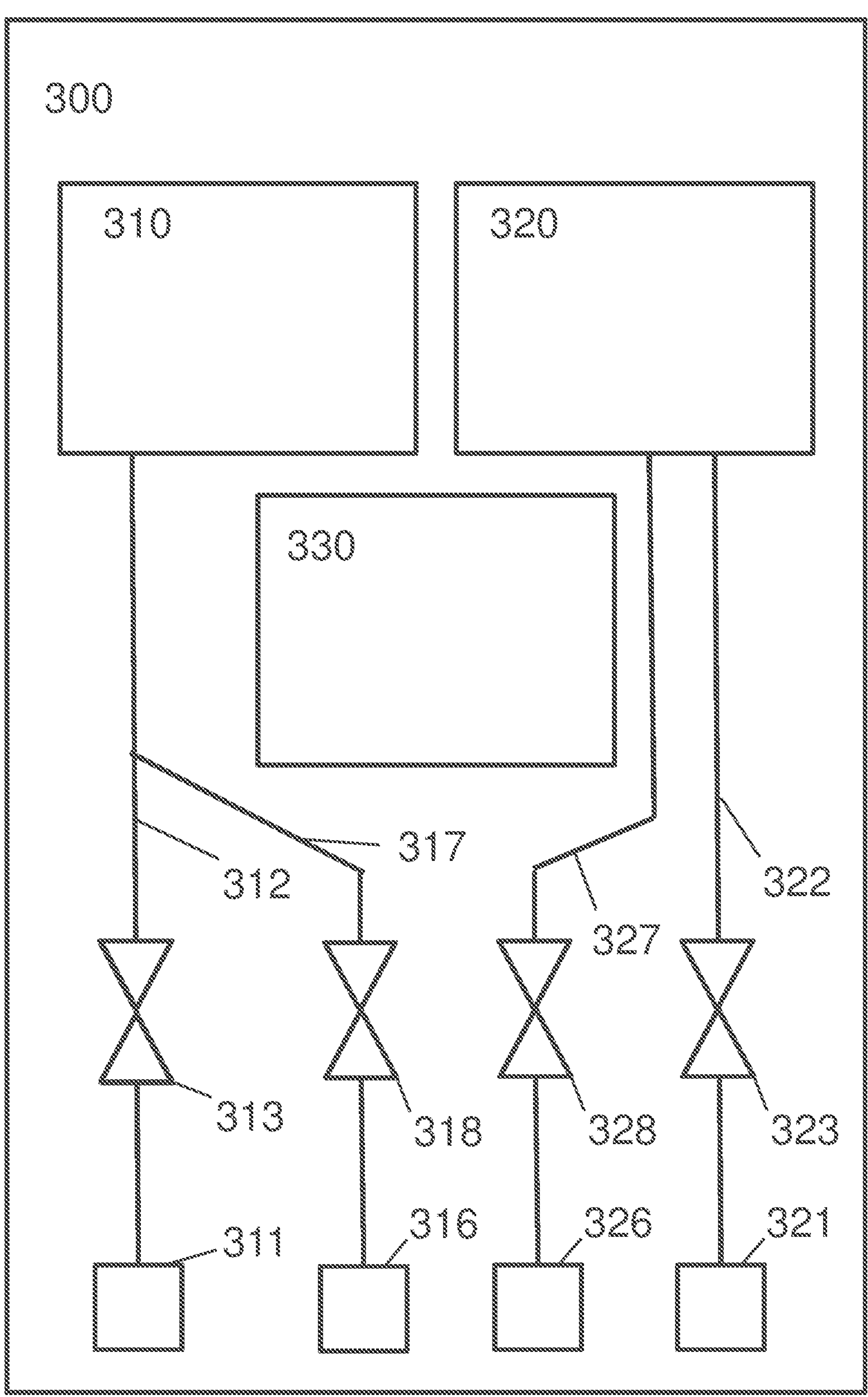
FIG. 3 shows an embodiment of a system (300) as described herein.

FIG. 3 shows an embodiment of a system (300) as described herein. The system (300) can be advantageously used for executing a method according to FIG. 2. In particular, the system (300) comprises an atomic layer etching chamber (310), an etchable layer deposition chamber (320), and a wafer handling robot (330). The atomic layer etching chamber (310) is in fluid connection with a conversion reactant source (311) by means of a conversion reactant gas line (312) that comprises a conversion reactant valve (313). In some embodiments, the conversion reactant source comprises a conversion reactant that comprises an oxygen containing gas, ion, or radical. The atomic layer etching chamber (310) is also in fluid connection with a volatilization reactant source (316) by means of a volatilization reactant gas line (317) that comprises a volatilization reactant valve (318). In some embodiments, the volatilization reactant source comprises a volatilization reactant that comprises a fluorine-containing gas, ion, or radical. Suitably, the atomic layer etching chamber (310) can be configured for carrying out a plurality of etching cycles. Individual etching cycles comprises executing a conversion pulse and a volatilization pulse. A conversion pulse comprises exposing the substrate to a conversion reactant. A volatilization pulse comprises exposing the substrate to a volatilization reactant.

The etchable layer deposition chamber (320) is in fluid connection with a deposition precursor source (321) by means of a deposition precursor gas line (322) that comprises a deposition precursor valve. The deposition precursor source (321) can comprise a metal precursor, such as a titanium precursor, such as a titanium halide, such as $TiCl_4$. The etchable layer deposition chamber (320) is further in fluid connection with a deposition reactant source (326) by means of a deposition reactant gas line (327) that comprises a deposition reactant valve (328). The deposition reactant source (326) can comprise an oxygen reactant, such as $O_2$.

The wafer handling robot (330) is constructed and arranged to provide a substrate to the atomic layer etching chamber (310). The wafer handling robot (330) is further constructed and arranged to transport the substrate from the atomic layer etching chamber (310) to the etchable layer deposition chamber (320) without breaking vacuum or while keeping the substrate in an inert gas.

Figure 4:
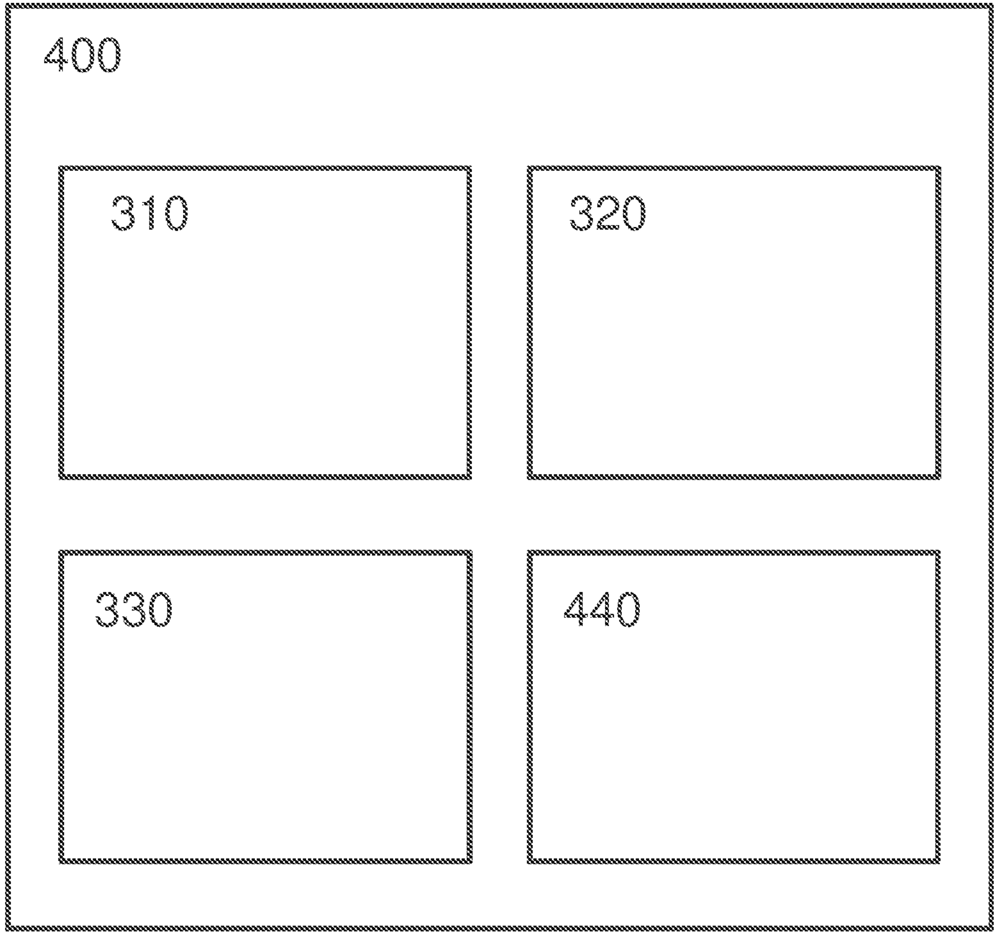
FIG. 4 shows another embodiment of a system (400) as described herein.
Figures 8A, 8B, 8C, 8D, 8E:
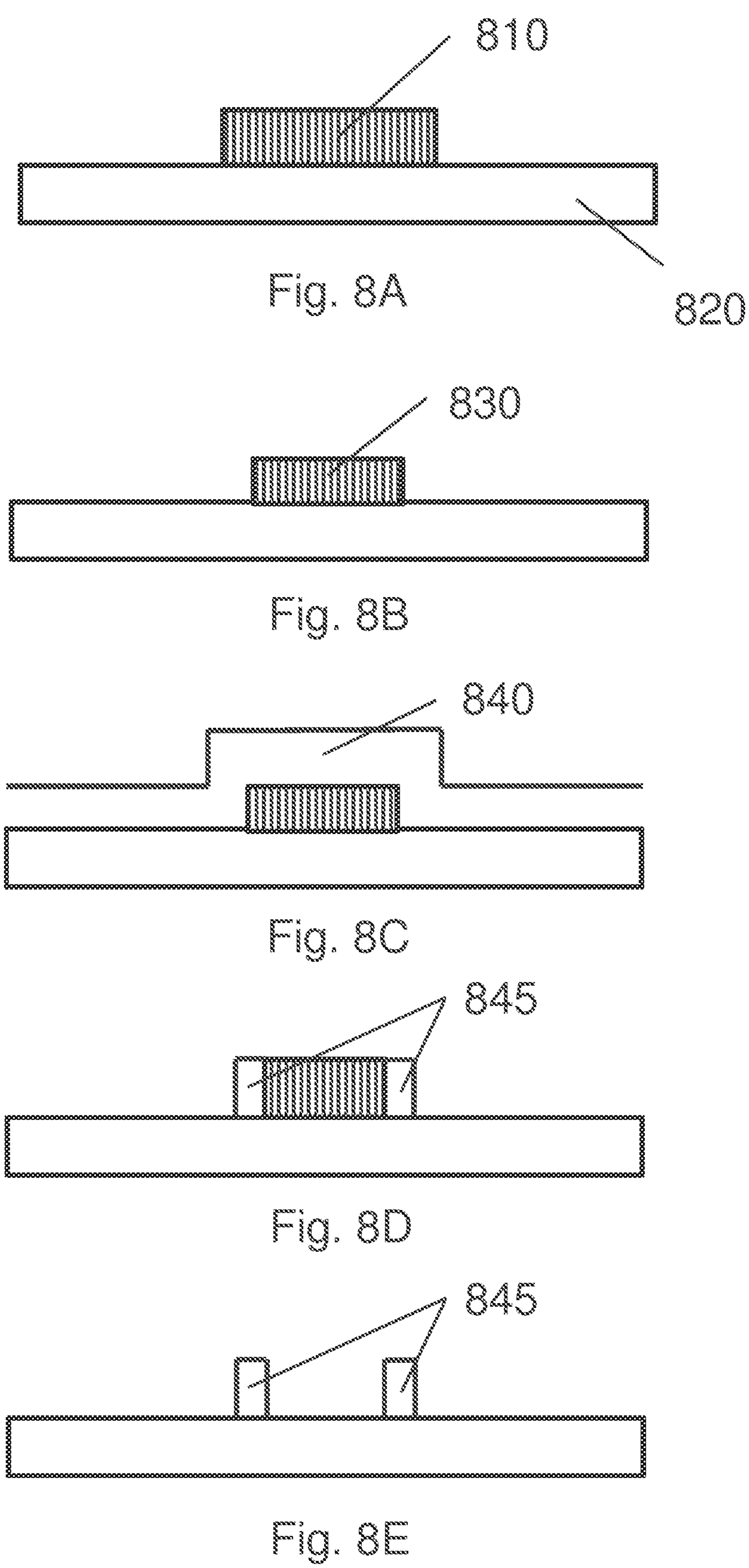
FIGS. 8A-8E show how a sequence of process steps as disclosed herein can be employed for forming patterned features with a small feature size on a substrate.

FIG. 4 shows another embodiment of a system (400) as described herein. The system (400) is similar to the system (300) according to the embodiment of FIG. 3, and also comprises an atomic layer etching chamber (310), an etchable layer deposition chamber (320), and a wafer handling robot (330) which are similarly configured. Note that for clarity, sources, gas lines, and valves, are, while present, omitted in FIG. 4. In addition, the system (400) according to the embodiment of FIG. 4 further comprises a reactive ion etching chamber (440). The reactive ion etching chamber is configured for carrying out a reactive ion etch. The reactive ion etching chamber can be suitably constructed and arranged for etching an etchable layer by means of an anisotropic etch to form spacers, such as schematically shown in FIG. 8D. The reactive ion etching chamber (440) is in fluid connection with a reactive ion etch gas source by means of a reactive ion etch gas line. The reactive ion etch gas line comprises a reactive ion etch gas valve. The wafer handling robot (330) is configured like that of the embodiment of FIG. 3. In addition, the wafer handling robot (330) according to the embodiment of FIG. 4 is configured to transport the substrate from the etchable layer deposition chamber to the reactive ion etching chamber without breaking vacuum or while keeping the substrate in an inert gas.

Figure 5:
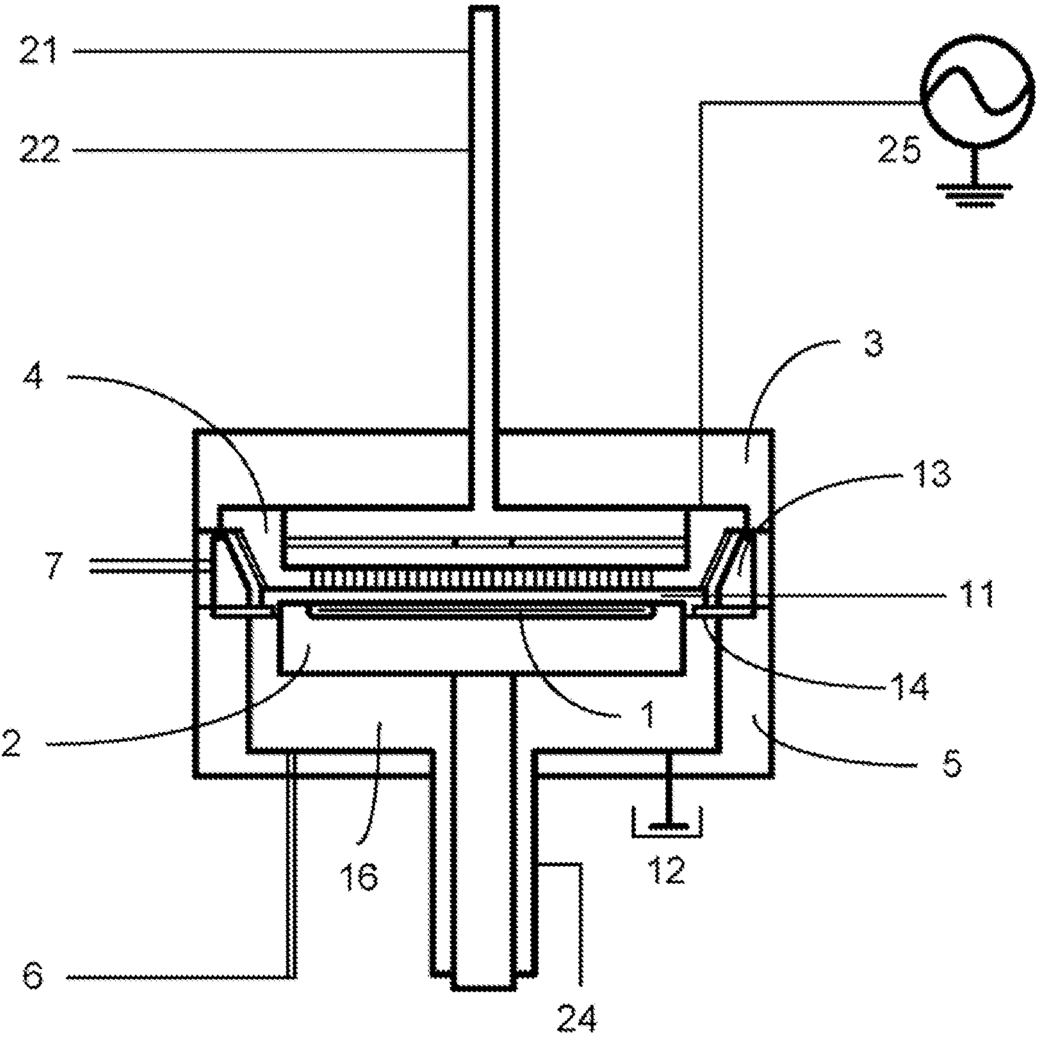
FIG. 5 schematically shows a view of a plasma-enhanced atomic layer deposition (PEALD) apparatus, usable in some embodiments of the present invention.

FIG. 5 schematically shows a view of a plasma-enhanced atomic layer deposition (PEALD) apparatus, usable in some embodiments of the present invention. In this figure, by providing a pair of electrically conductive flat-plate electrodes (2,4) in parallel and facing each other in the interior (11) (reaction zone) of a reaction chamber (3), applying RF power (e.g. at 13.56 MHz and/or 27 MHz) from a power source (25) to one side, and electrically grounding the other side (12), a plasma is excited between the electrodes. A temperature regulator may be provided in a lower stage (2), i.e. the lower electrode. A substrate (1) is placed thereon and its temperature is kept constant at a given temperature. The upper electrode (4) can serve as a shower plate as well, and a reactant gas and/or a dilution gas, if any, as well as a precursor gas can be introduced into the reaction chamber (3) through a first gas line (21) and a second gas line (22), respectively, and through the shower plate (4). Additionally, in the reaction chamber (3), a circular duct (13) with an exhaust line (17) is provided, through which the gas in the interior (11) of the reaction chamber (3) is exhausted. Additionally, a transfer chamber (5) is disposed below the reaction chamber (3) and is provided with a gas seal line (24) to introduce seal gas into the interior (11) of the reaction chamber (3) via the interior (16) of the transfer chamber (5) wherein a separation plate (14) for separating the reaction zone and the transfer zone is provided. Note that a gate valve through which a wafer may be transferred into or from the transfer chamber (5) is omitted from this figure. The transfer chamber is also provided with an exhaust line (6).

Figure 6:
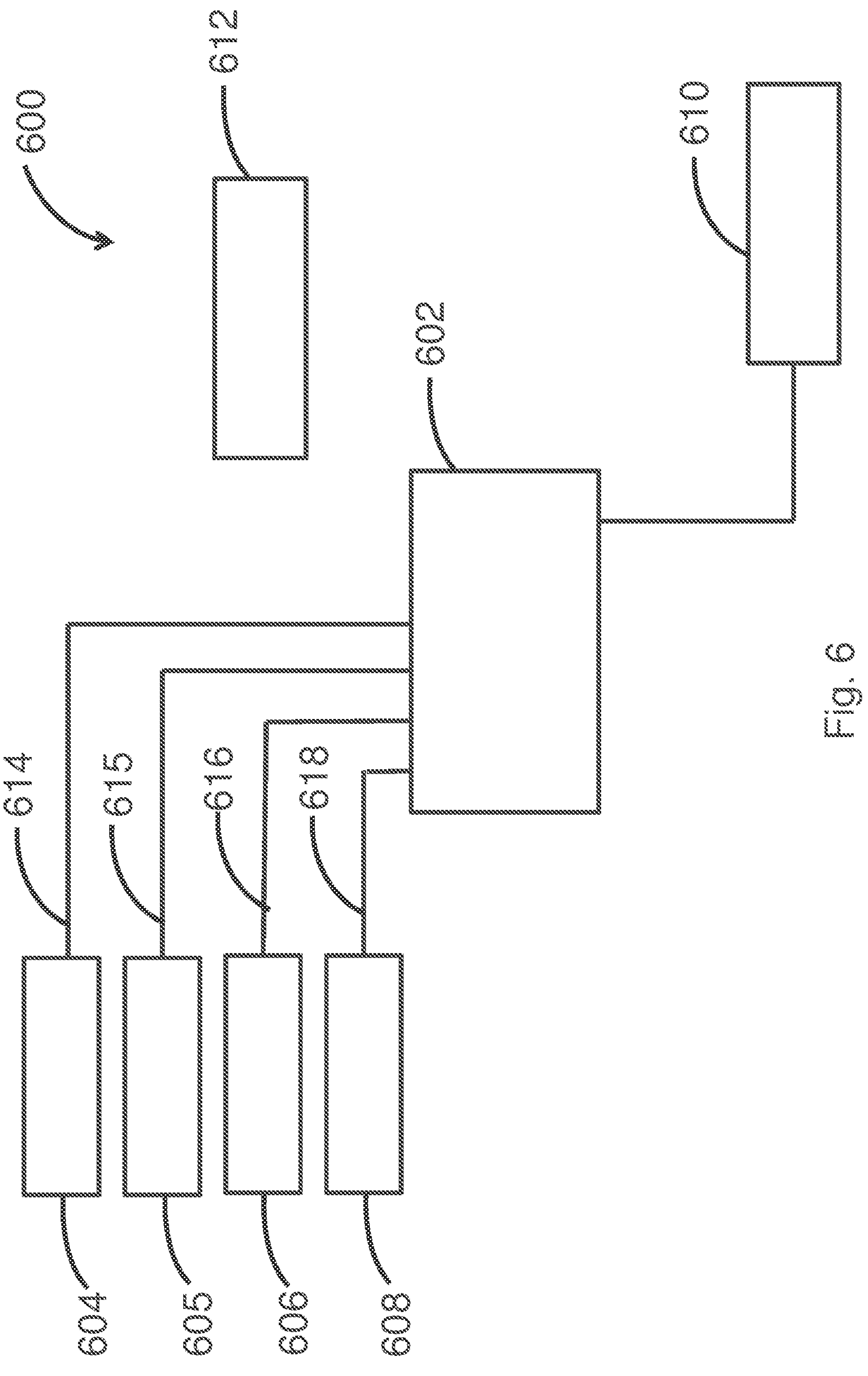
FIG. 6 illustrates a system (600) in accordance with additional exemplary embodiments of the disclosure.

FIG. 6 illustrates a system (600) in accordance with additional exemplary embodiments of the disclosure. The system (600) can be used to perform a method as described herein and/or to form a structure as described herein.

In the illustrated example, the system (600) includes one or more reaction chambers (602), a precursor gas source (604), a reactant gas source (605), and optional further gas sources (606,608). Of course, the system (600) can optionally comprise even more gas sources (not shown). The system further comprises an exhaust (610) and a controller (612).

The reaction chamber (602) can include any suitable reaction chamber, such as an ALD or CVD reaction chamber.

Any one of the gas sources (604-608) can include a vessel and one or more precursors, reactants, or other gasses as described herein. A gas source (604-608) can optionally comprise a mixing unit for mixing precursor with one or more carrier (e.g., noble) gases. A purge gas source (not shown) can, for example, include one or more noble gases as described herein. Although illustrated with four gas sources (604-608), the system (600) can include any suitable number of gas sources. The gas sources (604-608) can be coupled to one or more reaction chambers (602) via lines (614-618), which can include flow controllers, valves, heaters, and the like.

The exhaust (610) can include one or more vacuum pumps.

The controller (612) includes electronic circuitry and software to selectively operate valves, manifolds, heaters, pumps and other components included in the system (600). Such circuitry and components operate to introduce precursors, reactants, and purge gases from the respective sources (604-608). The controller (612) can control timing of gas pulse sequences, temperature of the substrate and/or reaction chamber, pressure within the reaction chamber, and various other operations to provide proper operation of the system (600).

The controller (612) can include control software to electrically or pneumatically control valves to control flow of precursors, reactants and purge gases into and out of the reaction chamber (602). The controller (612) can include modules such as a software or hardware component, e.g., a FPGA or ASIC, which performs certain tasks. A module can advantageously be configured to reside on the addressable storage medium of the control system and be configured to execute one or more processes.

Other configurations of the system (600) are possible, including different numbers and kinds of precursor and reactant sources, and the inclusion of one or more purge gas sources. Further, it will be appreciated that there are many arrangements of valves, conduits, precursor sources, and purge gas sources that may be used to accomplish the goal of selectively feeding gases into the reaction chamber (602). Further, as a schematic representation of a system, many components have been omitted for simplicity of illustration, and such components may include, for example, various valves, manifolds, purifiers, heaters, containers, vents, and/or bypasses.

During operation of the reactor system (600), substrates, such as semiconductor wafers (not illustrated), are transferred from, e.g., a substrate handling system to reaction chamber (602). Once substrate(s) are transferred to reaction chamber (602), one or more gases from the gas sources (604-608), such as precursors, reactants, carrier gases, and/or purge gases, are introduced into the reaction chamber (602).

In some cases, it will be understood that some gasses, such as $O_2$, $N_2$, $H_2$, He, and Ar, are very common and are used throughout a fabrication. Accordingly, they may not be necessarily stored in a vessel inside the tool but may, instead, be provided from a central storage unit (not shown, which may be a pressurized vessel) via gas lines to a system as described herein.

Figure 7A:
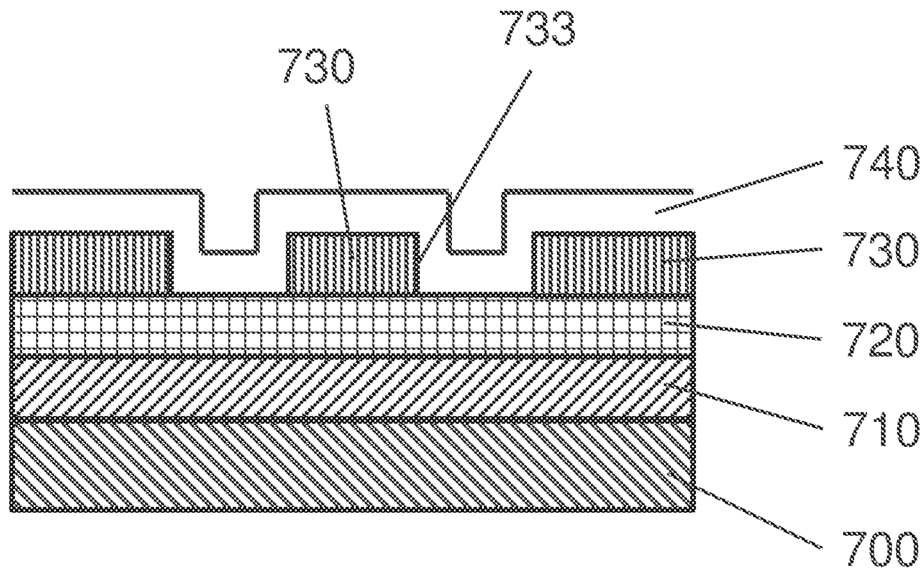
FIGS. 7A and 7B show structures that can be formed by way of embodiments of methods as disclosed herein.
Figure 7B:
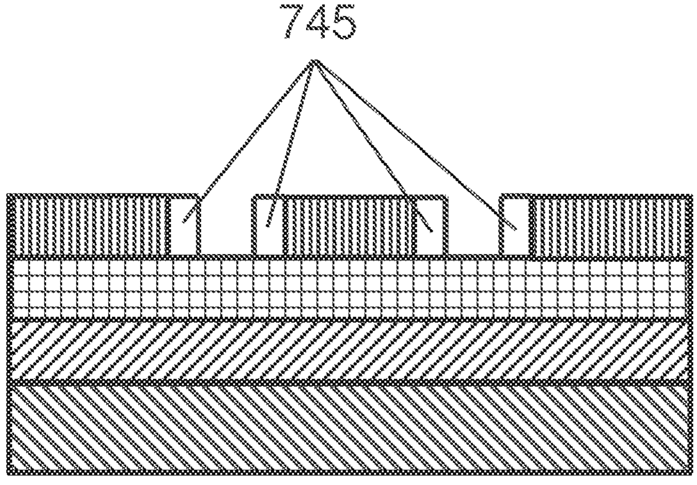

FIGS. 7A and 7B show structures that can be formed by way of embodiments of methods as disclosed herein. The structure of FIG. 7A comprises a substrate (700) on which a hard mask (710) is formed. Suitable substrates include silicon wafers on which one or more patterned or unpatterned layers and structures have been formed. The hard mask (710) can comprise, for example, a metal, a metal alloy, a semiconductor, an alloy of several semiconductors, amorphous carbon, a nitrogen and carbon-containing material, a metal nitride, a metal carbide, a metal oxide, or another suitable material. Suitably, and in some embodiments, the hard mask can have a thickness of at least 1.0 nm to at most 10.0 nm. An underlayer (720) is positioned on the hard mask (710). The underlayer (720) can comprise, for example, a metal such as Sn, Sb or In in addition to oxygen, and carbon. Thus, the underlayer (720) can comprise a metal oxycarbide. Additionally or alternatively, the underlayer (720) can comprise a silicon oxycarbide. The underlayer can have a thickness of less than 10 nm or less than or about 5 nm (such as 2 to 3 nm or more). Overlying the underlayer (720) is a mandrel (730) as described herein. The mandrel (730) comprises sidewalls (733). Overlying the mandrel (730) is an etchable layer (740).

The structure of FIG. 7B is similar to that of FIG. 7A in the sense that it also comprises a substrate (700), hard mask (710), underlayer (720), and patterned resist (730) as described before. The difference lies in the fact that during formation of the structure of FIG. 7B, the etchable layer (740) has been anisotropically etched to form a plurality of spacers (745). Since the etchable layer (740) is thicker at the sidewalls of the mandrel, when looked at in a direction perpendicular to the wafer, the anisotropic etch results in formation of the aforementioned spacers (745). Optionally, the mandrel (730) can then be etched away selectively vis-à-vis the spacers (745). Thus, the critical dimension of patterned structures can be advantageously reduced.

FIGS. 8A-8E show how a sequence of process steps as disclosed herein can be employed for forming patterned features with a small feature size on a substrate. In particular FIG. 8A shows a substrate (820) on which a structure (810) is formed. In FIG. 8B, the structure (810) has been thinned to form a mandrel (830). In FIG. 8C, an etchable layer (840) has been formed on the mandrel (830). In FIG. 8D, the etchable layer (840) has been subjected to an anisotropic etch to form spacers (845). In FIG. 8E, the mandrel has been etched away to form free-standing spacers (845). The critical dimension of the spacers, and the critical dimension between spacers, can be smaller than the size of the structure (810), which amounts to resolution enhancement compared to the resolution of the initial structure (810).

Figure 9:
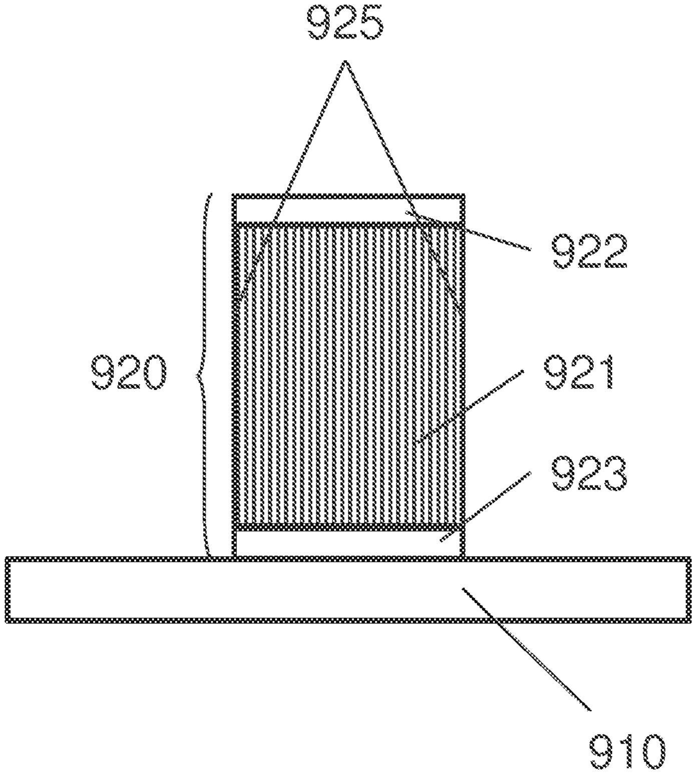
FIG. 9 shows an embodiment of a structure (920) as described herein that is formed on a substrate (910).

FIG. 9 shows an embodiment of a structure (920) as described herein that is formed on a substrate (910). The structure comprises a core (921), a proximal layer (922), and a distal layer (923). The core comprises amorphous silicon. The proximal layer (922) and the distal layer (923) comprise silicon oxide. The structure (920) further comprises sidewalls (925). Such a structure (920) can be thinned down using an atomic layer etch comprising alternating exposures to a conversion reactant comprising oxygen and a volatilization reactant comprising fluorine.

It shall be understood that the term "proximal" can indicate a layer, structure portion, or the like that extends from a substrate. In some embodiments, the term "proximal" can be mutually interchangeable by terms such as "top", "topmost", or "higher". It shall be understood that the term "distal" can indicate a layer, structure portion, or the like that directly or indirectly underlies another layer, such as one or more of a proximal layer and a core layer. In some embodiments, the term "distal" can be mutually interchangeable by terms such as "bottom", "lowest", or "lower".

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

We claim:

1. A method for forming a spacer, the method comprising
providing a system, the system comprising a first reaction chamber and a second reaction chamber;
forming a mandrel on a substrate in the first reaction chamber by;
providing the substrate to the first reaction chamber, the substrate comprising a material layer and a structure, the structure comprising a distal portion, a proximal portion, and two substantially parallel sidewalls; and
carrying out a plurality of etching cycles, ones from the plurality of etching cycles comprising subsequently executing a conversion pulse and a volatilization pulse,
wherein the conversion pulse comprises exposing the substrate to a conversion reactant, thereby forming a converted surface layer on the sidewalls, and
wherein the volatilization pulse comprises exposing the substrate to a volatilization reactant, thereby volatilizing the converted surface layer;
providing the substrate to the second reaction chamber while keeping the substrate in vacuum or while keeping the substrate in an inert gas;
forming an etchable layer on the substrate in the second reaction chamber;
etching the etchable layer by a directional etch; and
selectively etching the mandrel vis-à-vis the etchable layer and the material layer.

2. The method according to claim 1, wherein the etching cycles are repeated until a pre-determined thickness of the structure has been removed from the sidewalls, the pre-determined thickness being from at least 1 nm to at most 10 nm.

3. The method according to claim 1, wherein a distance between the distal portion and the proximal portion is greater than a distance between the two substantially parallel sidewalls.

4. The method according to claim 1, wherein the system further comprises a third reaction chamber, the method further comprising providing the substrate to the third reaction chamber while keeping the substrate in vacuum or while keeping the substrate in an inert gas.

5. The method according to claim 1, wherein the distal portion comprises a distal layer, the distal layer overlying the material layer;

the proximal portion of the structure comprises a proximal layer; and the structure further comprising a core layer, the core layer being positioned between the distal layer and the proximal layer, two edges of the core layer forming the sidewalls.

6. The method according to claim 5, wherein the distal layer and the proximal layer have a first composition, wherein the core layer has a second composition, wherein the first composition and the second composition are different.

7. The method according to claim 6, wherein the distal layer and the proximal layer substantially consist of silicon oxide, and wherein the core layer substantially consists of amorphous silicon.

8. The method according to claim 1, wherein the conversion reactant comprises an oxygen reactant.

9. The method according to claim 8, wherein the oxygen reactant is selected from $O_2$, $O_3$, $H_2O$, and $H_2O_2$, $N_2O$, NO, $NO_2$, and oxygen-containing plasma.

10. The method according to claim 1, wherein the volatilization reactant comprises a fluorine species.

11. The method according to claim 10, wherein the fluorine species are generated using a plasma.

12. The method according to claim 10, wherein the fluorine species is selected from fluorine radicals, fluoride ions, $F_2$, HF, and $NF_3$.

13. A method of patterning a substrate, the method comprising providing a substrate comprising a patternable layer;

forming a structural layer on the patternable layer;

forming a photosensitive layer on the structural layer;

exposing the photosensitive layer to electromagnetic radiation through a mask, thereby forming exposed areas of the patternable layer and unexposed areas of the patternable layer;

selectively removing one of the exposed areas and the unexposed areas;

etching the patternable layer in one of the exposed areas and the unexposed areas, thereby forming a plurality of structures on the substrate;

removing the photosensitive layer from the substrate;

forming a plurality of spacers on the substrate by;

providing the substrate to a reaction chamber, the substrate comprising a material layer and each structure of the plurality of structures comprising a distal portion, a proximal portion, and two substantially parallel sidewalls; and carrying out a plurality of etching cycles, ones from the plurality of etching cycles comprising subsequently executing a conversion pulse and a volatilization pulse, wherein the conversion pulse comprises exposing the substrate to a conversion reactant, thereby forming a converted surface layer on the sidewalls, and wherein the volatilization pulse comprises exposing the substrate to a volatilization reactant, thereby volatilizing the converted surface layer; and selectively etching the patternable layer vis-à-vis the plurality of spacers.

14. The method according to claim 13, wherein the etching cycles are repeated until a pre-determined thickness of the structure has been removed from the sidewalls, the pre-determined thickness being from at least 1 nm to at most 10 nm.

15. The method according to claim 13, wherein the distal portion comprises a distal layer, the distal layer overlying the material layer;

the proximal portion of the structure comprises a proximal layer; and the structure further comprising a core layer, the core layer being positioned between the distal layer and the proximal layer, two edges of the core layer forming the sidewalls.

16. The method according to claim 13, wherein a distance between the distal portion and the proximal portion is greater than a distance between the two substantially parallel sidewalls.

17. A method of patterning a substrate, the method comprising providing a substrate comprising a patternable layer;

forming a photosensitive layer on the patternable layer;

exposing the photosensitive layer to electromagnetic radiation through a mask, thereby forming exposed areas of the patternable layer and unexposed areas of the patternable layer;

forming a plurality of structures on one of the exposed areas and the unexposed areas of the patternable layer;

forming a plurality of mandrels on the substrate by:

providing the substrate to a reaction chamber, the substrate comprising a material layer and each structure of the plurality of structures comprising a distal portion, a proximal portion, and two substantially parallel sidewalls; and carrying out a plurality of etching cycles, ones from the plurality of etching cycles comprising subsequently executing a conversion pulse and a volatilization pulse, wherein the conversion pulse comprises exposing the substrate to a conversion reactant, thereby forming a converted surface layer on the sidewalls, and wherein the volatilization pulse comprises exposing the substrate to a volatilization reactant, thereby volatilizing the converted surface layer; and selectively etching the patternable layer vis-à-vis the plurality of mandrels.

18. The method according to claim 17, wherein the etching cycles are repeated until a pre-determined thickness of the structure has been removed from the sidewalls, the pre-determined thickness being from at least 1 nm to at most 10 nm.

19. The method according to claim 17, wherein the distal portion comprises a distal layer, the distal layer overlying the material layer;

the proximal portion of the structure comprises a proximal layer; and the structure further comprising a core layer, the core layer being positioned between the distal layer and the proximal layer, two edges of the core layer forming the sidewalls.

20. The method according to claim 17, wherein a distance between the distal portion and the proximal portion is greater than a distance between the two substantially parallel sidewalls.

* * * * *